US010303839B2

(12) United States Patent
Kekare

(10) Patent No.: US 10,303,839 B2
(45) Date of Patent: May 28, 2019

(54) ELECTRICALLY RELEVANT PLACEMENT OF METROLOGY TARGETS USING DESIGN ANALYSIS

(71) Applicant: KLA-Tencor Corporation, Milpitas, CA (US)

(72) Inventor: Sagar A. Kekare, Milpitas, CA (US)

(73) Assignee: KLA-Tencor Corporation, Milpitas, CA (US)

(*) Notice: Subject to any disclaimer, the term of this patent is extended or adjusted under 35 U.S.C. 154(b) by 0 days.

(21) Appl. No.: 15/385,564

(22) Filed: Dec. 20, 2016

(65) Prior Publication Data
US 2017/0351804 A1 Dec. 7, 2017

Related U.S. Application Data

(60) Provisional application No. 62/346,774, filed on Jun. 7, 2016, provisional application No. 62/427,009, filed on Nov. 28, 2016.

(51) Int. Cl.
G06F 17/50 (2006.01)

(52) U.S. Cl.
CPC ...... G06F 17/5081 (2013.01); G06F 17/5072 (2013.01)

(58) Field of Classification Search
CPC .................. G06F 17/5081; G06F 17/5072
See application file for complete search history.

(56) References Cited

U.S. PATENT DOCUMENTS

| 7,346,878 B1* | 3/2008 | Cohen ................ G06F 17/5068 716/55 |
| 7,526,749 B2* | 4/2009 | Levinski ............. G03F 7/70633 716/50 |
| 7,642,101 B2 | 1/2010 | Liu et al. |
| 7,774,153 B1 | 8/2010 | Smith |
| 7,808,643 B2 | 10/2010 | Smith et al. |
| 8,549,445 B2 | 10/2013 | Kekare |
| 9,151,712 B1 | 10/2015 | Adel et al. |
| 9,230,867 B2 | 1/2016 | Cheng et al. |
| 9,400,865 B2 | 7/2016 | Kekare et al. |
| 9,410,902 B1* | 8/2016 | Liou .................. G01N 21/9501 |
| 9,823,574 B2* | 11/2017 | Chen .................. G03F 7/70141 |
| 2005/0132254 A1* | 6/2005 | Shiota .............. G01R 31/31835 714/30 |
| 2007/0050749 A1* | 3/2007 | Ye ............................. G03F 1/44 430/30 |
| 2007/0105029 A1 | 5/2007 | Ausschnitt |
| 2007/0230770 A1* | 10/2007 | Kulkarni ............. G06F 17/5045 382/149 |

(Continued)

Primary Examiner — Nha T Nguyen
(74) Attorney, Agent, or Firm — Suiter Swantz pc llo

(57) ABSTRACT

Methods and systems for determining electrically relevant placement of metrology targets using design analysis are disclosed. The method may include: identifying at least one critical design element of an integrated circuit based on a design of the integrated circuit; determining whether the design of the integrated circuit allows for an insertion of a metrology target in a vicinity of the at least one critical design element; and modifying the design of the integrated circuit by inserting a metrology target into the vicinity of the at least one critical design element when the design of the integrated circuit allows for the insertion of the metrology target.

15 Claims, 2 Drawing Sheets

(56) References Cited

U.S. PATENT DOCUMENTS

| | | | |
|---|---|---|---|
| 2009/0007030 A1* | 1/2009 | Nehmadi | G03F 1/36 |
| | | | 716/136 |
| 2009/0193367 A1* | 7/2009 | Deppe | G03F 1/44 |
| | | | 716/100 |
| 2010/0005442 A1* | 1/2010 | Ghinovker | G03F 7/70633 |
| | | | 716/55 |
| 2011/0170091 A1* | 7/2011 | Chang | G01N 21/9501 |
| | | | 356/237.5 |
| 2011/0229830 A1 | 9/2011 | Bhattacharyya et al. | |
| 2012/0146159 A1* | 6/2012 | Wang | G03F 7/70633 |
| | | | 257/410 |
| 2012/0308112 A1* | 12/2012 | Hu | G01N 21/9501 |
| | | | 382/149 |
| 2013/0147066 A1* | 6/2013 | Cheng | G03F 7/70633 |
| | | | 257/797 |
| 2013/0201461 A1* | 8/2013 | Huang | G03F 1/44 |
| | | | 355/52 |
| 2013/0293890 A1 | 11/2013 | Amir et al. | |
| 2013/0295698 A1* | 11/2013 | Pforr | G03F 1/38 |
| | | | 438/14 |
| 2014/0199791 A1* | 7/2014 | Park | H01L 22/12 |
| | | | 438/14 |
| 2015/0113494 A1* | 4/2015 | Maling | H01L 22/12 |
| | | | 716/122 |
| 2015/0270181 A1* | 9/2015 | De | G01R 31/26 |
| | | | 438/14 |
| 2015/0323316 A1* | 11/2015 | Shchegrov | G01N 21/9501 |
| | | | 702/150 |
| 2016/0196379 A1* | 7/2016 | Adel | G03F 1/36 |
| | | | 716/52 |

* cited by examiner

ELECTRICALLY RELEVANT PLACEMENT OF METROLOGY TARGETS USING DESIGN ANALYSIS

CROSS-REFERENCE TO RELATED APPLICATIONS

The present application claims the benefit under 35 U.S.C. § 119(e) of U.S. Provisional Application Ser. No. 62/346,774, filed Jun. 7, 2016. Said U.S. Provisional Application Ser. No. 62/346,774 is hereby incorporated by reference in its entirety.

The present application also claims the benefit under 35 U.S.C. § 119(e) of U.S. Provisional Application Ser. No. 62/427,009, filed Nov. 28, 2016. Said U.S. Provisional Application Ser. No. 62/427,009 is hereby incorporated by reference in its entirety.

TECHNICAL FIELD

The disclosure generally relates to the field of inspection and metrology, and particularly to inspection and metrology of semiconductor devices.

BACKGROUND

Thin polished plates such as silicon wafers and the like are a very important part of modern technology. A wafer, for instance, may refer to a thin slice of semiconductor material used in the fabrication of integrated circuits and other devices. Other examples of thin polished plates may include magnetic disc substrates, gauge blocks and the like. While the technique described here refers mainly to wafers, it is to be understood that the technique also is applicable to other types of polished plates as well. The term wafer and the term thin polished plate may be used interchangeably in the present disclosure.

Modern semiconductor devices are typically fabricated from layers of semiconductor, conductor or isolator material printed on wafers using various (e.g., photolithography) techniques. Precise positioning and alignment during semiconductor fabrication are of critical importance.

Currently available quality assurance methods may measure critical dimension (CD) and overlay on formal metrology targets in the scribe lanes between adjacent chips. Some recently developed quality assurance methods may also measure CD and overlay on suitable but randomly picked targets from within the layout of the chip based strictly on physical attributes of the chip. It is noted that these targets have no relation to the electrically critical design elements, and as such the measurements from such targets may not always reflect the dimensional fidelity or overlay on the critical design elements at all. On the contrary, when the electrically critical design elements show failure to perform during the end of line test, or worse in the actual customer usage, there is little probability that the data from these targets can explain such failures.

SUMMARY

The present disclosure is directed to a method. The method may include: identifying at least one critical design element of an integrated circuit based on a design of the integrated circuit; determining whether the design of the integrated circuit allows for an insertion of a metrology target in a vicinity of the at least one critical design element; and modifying the design of the integrated circuit by inserting a metrology target into the vicinity of the at least one critical design element when the design of the integrated circuit allows for the insertion of the metrology target.

A further embodiment of the present disclosure is a method. The method may include: identifying at least one critical design element of an integrated circuit based on a design of the integrated circuit; determining whether the design of the integrated circuit allows for an insertion of a metrology target in a vicinity of the at least one critical design element; designating one or more existing features on or in the vicinity of the at least one critical design element as a metrology target; and providing the one or more existing features designated as the metrology target to an inspection tool to facilitate metrology inspection.

An additional embodiment of the present disclosure is directed to an apparatus. The apparatus may include a memory medium configured to store a library of metrology targets and a processor in communication with the memory medium. The processor may be configured to: identify at least one critical design element of an integrated circuit based on a design of the integrated circuit; determine whether the design of the integrated circuit allows for an insertion of a metrology target in a vicinity of the at least one critical design element; and modify the design of the integrated circuit by inserting a metrology target selected from the library of metrology targets into the vicinity of the at least one critical design element when the design of the integrated circuit allows for the insertion of the metrology target.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which.

DETAILED DESCRIPTION

Reference will now be made in detail to the subject matter disclosed, which is illustrated in the accompanying drawings.

Embodiments in accordance with the present disclosure are directed to systems and methods for providing targeted in-chip placement of metrology targets based on integrated circuit (IC) design analysis. More specifically, in some embodiments, a target placement method may be utilized to analyze the logical and electrical design of an IC to identify suitable inspection sites. The method may also determine how to place targets at these identified inspection sites, effectively allowing targets to be provided at high granularity and at locations in the chip layout that are in close proximity to metrology (e.g., overlay) sensitive and electrically critical IC design elements. It is contemplated that the targets placed as such may allow inspection tools to effectively assess true patterning fidelity to drawn dimensions as well as layer to layer overlay performance of the various semiconductor fabrication steps.

Figure 1:
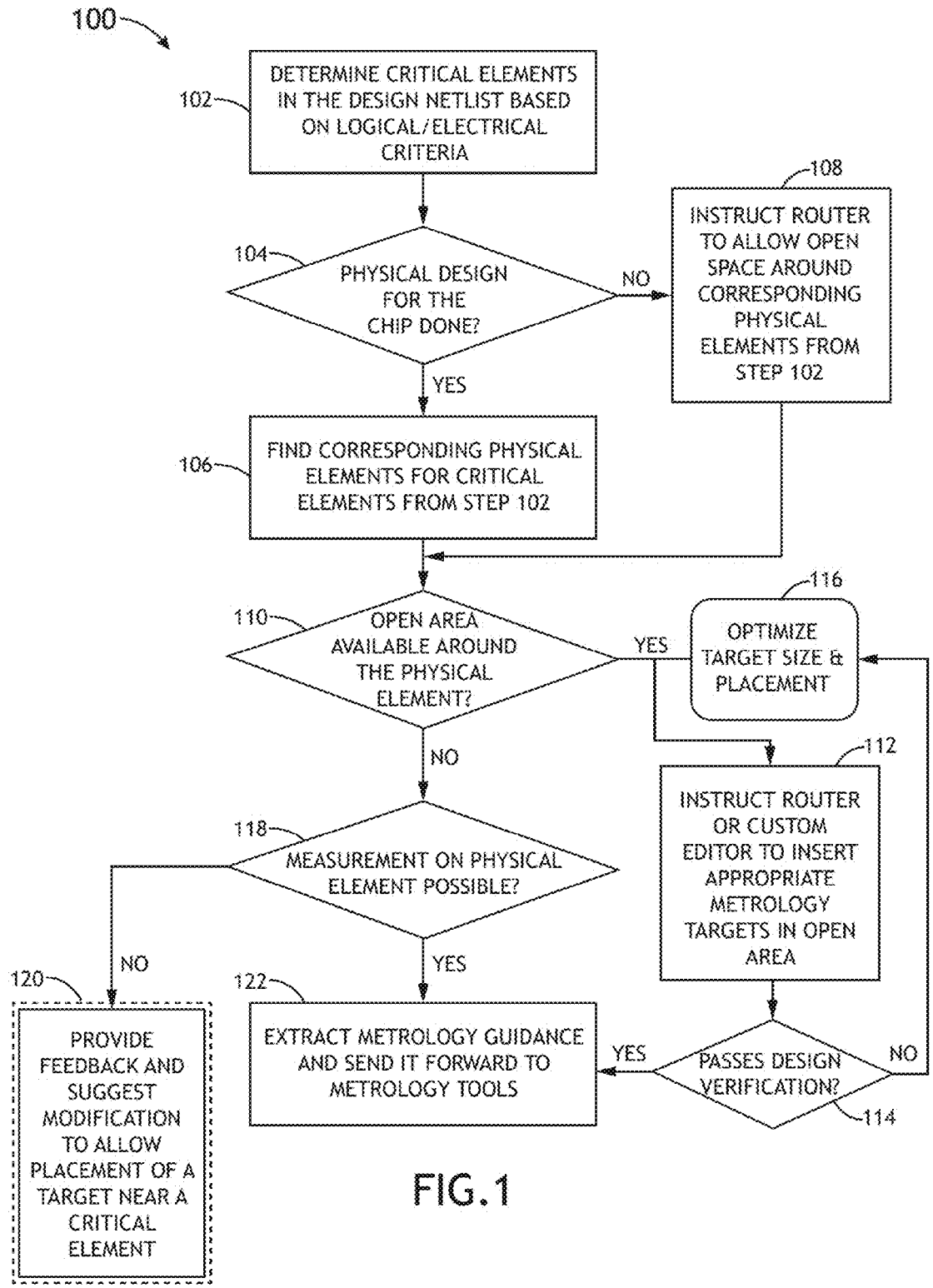
FIG. 1 is a flow diagram depicting a target placement method configured in accordance with an embodiment of the present disclosure.

Referring generally to FIG. 1, a flow diagram depicting a target placement method 100 configured in accordance with an embodiment of the present disclosure is shown. The target placement method 100 may be configured to identify one or more critical design elements (e.g., critical paths) of an IC by analyzing the logical and electrical design of the IC in a step 102. It is contemplated that various techniques may be utilized to help identify the critical design elements. For instance, in some embodiments, delay and/or resistance checks may be performed to help identify the critical design elements. Alternatively and/or additionally, one or more reports from various types of design criticality analyses already performed (e.g., as a part of nominal design verification and sign off process) may be also be utilized to help identify the critical design elements. Furthermore, a library of metrology targets (e.g., stored in a memory medium) within a range of size, shape and imaging attributes well suited for in-line CD and overlay metrology may also be taken into consideration in the critical design elements identification step 102, which may identify and trace the physical shapes across all mask layers of the IC to help identify the critical design elements.

With the critical design elements identified, additional steps may be taken to help place metrology targets near them. For example, if the physical design of the IC has been finalized (as determined in a step 104), a step 106 may be invoked to find physical elements corresponding to the identified critical design elements, and a step 110 may be utilized to find suitable open areas near these physical elements. On the other hand, if the physical design of the IC has not been finalized, there may still be opportunities to invoke a design modification step 108 to modify the design so that open areas can be created around the physical elements corresponding to the identified critical design elements.

The purpose of finding (or creating) open areas around these physical elements is to help optimize metrology target placement for the critical design elements identified. In one embodiment, a target from a metrology library is selected which fits the available size, aspect ratio, shape of an open area, and has good imaging attributes given the material contrasts available at the mask layer for an open area. For instance, if there is a suitable open area near a particular critical design element, a step 112 may choose to insert one or more suitable metrology targets in this open area to help improve proper alignment of that particular critical design element. This open area may be a location closest to the particular critical design element in a X-Y coordinate system, but not occupied by any other physical elements that already exist in the design. On the other hand, if there is no suitable open area near a particular critical design element, a step 118 may be invoked to help determine whether any existing physical elements/features within the surrounding area can serve as metrology targets themselves. If it is determined that no physical element/feature within the surrounding area can serve as a metrology target, such a determination may be provided (in an optional step 120) to an IC designer, who may choose to redesign the IC based on this information. On the other hand, if it is determined that some physical elements/features within the surrounding area can serve as metrology target(s) (e.g., if such features exhibit certain geometrical patterns that can used as a reference target, or such features offer certain imaging advantages making metrology inherently easier, or such features are connected to other features in other mask layers where this connection facilitates rapid capture of any pattern placement errors, etc.), these physical elements/features may be designated as such in a step 122.

Referring back to step 112, where one or more suitable metrology targets may be inserted into an open area near a particular critical design element to help improve proper alignment of this particular critical design element, it is contemplated that because inserting metrology targets in this manner may have the potential to introduce changes to the IC and the potential to modify the criticalities of the various elements contained therein, a design verification step 114 may be invoked in certain embodiments to help verify whether the metrology target(s) inserted can still pass physical verification signoff on the design. For instance, in some embodiments, design rule checking (DRC) and/or layout versus schematic (LVS) checking may be invoked to help verify the validity of the metrology targets proposed to be inserted. If the proposed insertion passes verification (e.g., inserting the metrology targets as proposed will still satisfy the design rules), insertion of these metrology targets may be approved. On the other hand, if it is determined that the proposed insertion violates one or more of the design rules, the proposed metrology targets may be reevaluated and/or optimized (e.g., in terms of size and/or placement) in a step 116 until the proposed insertion can pass the verification step 114.

It is contemplated that the proposed metrology targets to be inserted may be reevaluated and/or optimized in various manners. For instance, the step 116 may invoke a target insertion algorithm configured to handle this specific task. In some embodiments, the target insertion algorithm may be configured to select from a metrology target library a particular target that fits the available size, the aspect ratio, and the shape of the open area. The particular target may also be selected to provide good imaging attributes given the material contrasts available at the mask layer for that area. In some embodiments, the target may be selected to provide a metrology structure oriented in a direction most susceptible to cause failure in the critical design element. For example, if the critical design element is a vertical metal line most susceptible to cause failure in the horizontal direction, the target selected may preferably provide an overlay measurement in the horizontal direction first. A second/additional target that can enable overlay measurement in the vertical direction may be inserted near the first target if space permits.

It is to be understood that the target insertion algorithm described above is presented merely for illustrative purposes and is not meant to be limiting. It is contemplated that various other types of algorithms may be utilized to help determine where and how target(s) can be inserted without departing from the spirit and scope of the present disclosure. It is also contemplated that after the metrology target(s) have been inserted, various types of verification steps may be utilized again to help verify the modified design to ensure that the target insertion(s) have not inadvertently shifted the electrical behavior of the IC, particularly along the critical design elements.

As will be appreciated from the descriptions above, the target placement method 100 configured in accordance with the present disclosure is capable of intentionally inserting/placing/designating metrology target(s) in the nearest vicinity of design critical design elements, which may be identified based on nominal design verification and sign-off data. It is contemplated that the targets placed/designated in this manner may be provided to metrology tools (as shown in step 122), allowing the metrology tools to effectively assess true patterning fidelity to drawn dimensions as well as layer to layer overlay performance of the various semiconductor fabrication steps.

It is also contemplated that since the targets placed in manners in accordance with the present disclosure may be very small, it may be beneficial to use electron beam (e-beam) inspection tools to help inspect ICs fabricated to contain such targets. For instance, during mask qualification, or during wafer level metrology operation, the targets placed in accordance with the present disclosure may be imaged with e-beam imaging at the appropriate layers. The data obtained may be considered to be a true metrology where a specific, precise measurement was taken. Alternatively, the data may be treated as a qualitative indicator of general health of the design critical design elements. Additionally, sample planning strategies may be employed as guided by previous knowledge of failures of the design critical design elements, in terms of number of wafers and dice to be measured, as well as the spatial location of these dice on the wafer. Correlation engines can also treat the data collected as an attribute of a specific location, along the design critical design elements, thus enabling a singular or combinatorial correlation to the functioning and performance of these design critical design elements as well as the packaged testing phase of the fabrication process.

Furthermore, it is noted that measurements taken off of the targets placed in manners in accordance with the present disclosure may closely approximate the actual process conditions on the design critical design elements. After a suitable period of validation of this hypothesis through correlation of metrology data to electrical testing data, these measurements may serve as the best available early warning signals for the fabrication process.

Figure 2:
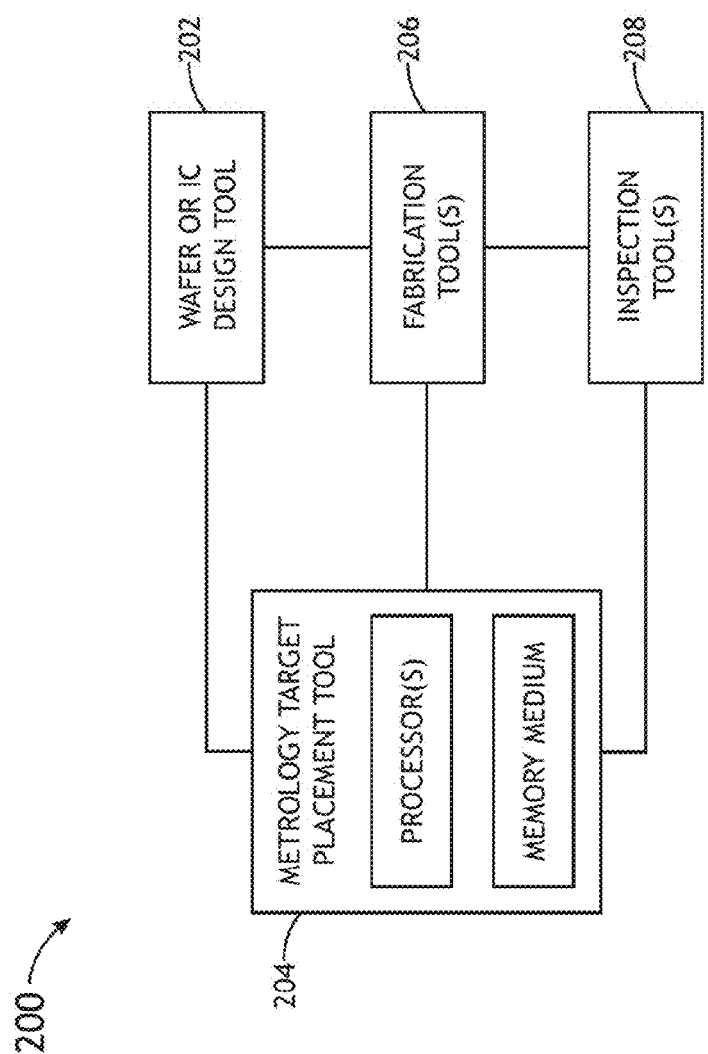
FIG. 2 is a block diagram depicting a wafer production system using a metrology target placement tool configured in accordance with an embodiment of the present disclosure.

Referring now to FIG. 2, a block diagram depicting a wafer production system 200 configured in accordance with embodiments of the present disclosure is shown. The wafer production system 200 may include a design tool 202 configured to facilitate design of a wafer (or an integrated circuit). The design tool 202 may be used for logical, electrical, physical, mask, or wafer level designs. The design tool 202 may be communicatively coupled to a metrology target placement tool 204 and one or more fabrication tools 206. The metrology target placement tool 204 may be configured to provide targeted in-chip placement of metrology targets based on the design of the wafer (or the IC) and the fabrication tools 206 may be configured to fabricate the wafer (or the IC) according to information provided by the design tool 202 and the metrology target placement tool 204.

The wafer production system 200 may also include one or more inspection tools 208 (e.g., metrology tools) configured to inspect the wafer (or the IC) at various stages of the fabrication process. For instance, one or more inspection tools 208 may be configured to obtain images (e.g., e-beam images) of one or more metrology targets specified by the metrology target placement tool 204. It is contemplated that these targets may allow the inspection tools 208 to effectively assess true patterning fidelity to drawn dimensions as well as layer to layer overlay performance of the various fabrication tools 206. It is also contemplated that some of the inspection results may be utilized to provide early warning signals for the fabrication tools 206. The metrology and/or inspection tools may be integrated closely into the processing tools for in-situ metrology/inspection during actual wafer processing.

It is to be understood that the design tool 202 and the metrology target placement tool 204 are depicted as separate blocks in FIG. 2 merely for illustrative purposes. It is contemplated that the design tool 202 and the metrology target placement tool 204 may be implemented jointly or separately without departing from the spirit and scope of the present disclosure. It is also contemplated that the design tool 202 and the metrology target placement tool 204 may be coupled to the fabrication tools 206 and the inspection tools 208 in any suitable manner (e.g., via one or more transmission media, which may include "wired" and/or "wireless" transmission media) without departing from the spirit and scope of the present disclosure.

It is further contemplated that the inspection tools 208 may be configured to perform a number of functions using the images obtained. For instance, the inspection tools 208 may include one or more processors configured to detect defects on the specimen using the images obtained. Detecting the defects on the specimen may be performed by the processors by applying some defect detection algorithm and/or method to the images obtained. The defect detection algorithm and/or method may include any suitable algorithm and/or method known in the art. For example, the processors may quantify some detected features and compare them to a threshold. Any output having values above the threshold may be identified as a potential defect while any output having values below the threshold may not be identified as a potential defect. In another example, the processors may be configured to send the images obtained to a storage medium (not shown in FIG. 2) without performing defect detection on the output.

It is contemplated that the design tool 202 and the metrology target placement tool 204 may be implemented as one or more processors or computer systems. Each of the computer system(s) described herein may take various forms, including a personal computer system, image computer, mainframe computer system, workstation, network appliance, Internet appliance, or other device. In general, the term "computer system" may be broadly defined to encompass any device having one or more processors, which executes instructions from a memory medium. The computer subsystem(s) or system(s) may also include any suitable processor known in the art such as a parallel processor. In addition, the computer subsystem(s) or system(s) may include a computer platform with high speed processing and software, either as a standalone or a networked tool.

If a computer system includes more than one computer subsystem, then the different computer subsystems may be coupled to each other such that images, data, information, instructions, etc. can be sent between the computer subsystems as described further herein. For example, one computer subsystem may be coupled to additional computer subsystem(s) by any suitable transmission media, which may include any suitable wired and/or wireless transmission media known in the art. Two or more of such computer subsystems may also be effectively coupled by a shared computer-readable storage medium.

It is contemplated that an additional embodiment of the present disclosure relates to a non-transitory computer-readable medium storing program instructions executable on a computer system for performing a computer-implemented method for target placement as described above. The computer-readable medium may be a storage medium such as a magnetic or optical disk, a magnetic tape, or any other suitable non-transitory computer-readable medium known in the art. The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes ("MFC"), SSE (Streaming SIMD Extension) or other technologies or methodologies, as desired.

It is to be understood that while the examples above referred to wafers, the systems and methods in accordance with the present disclosure are applicable to other types of polished plates as well without departing from the spirit and scope of the present disclosure. The term wafer used in the present disclosure may include a thin slice of semiconductor material used in the fabrication of integrated circuits and other devices, as well as other thin polished plates such as magnetic disc substrates, gauge blocks, liquid crystal display substrates, chip packaging substrates, and the like.

It is contemplated that the methods and systems described in the present disclosure may be implemented as standalone products or as components of various wafer measurement, inspection, and/or design tools. It is understood that the specific order or hierarchy of steps in the methods disclosed are examples of exemplary approaches. Based upon design preferences, it is understood that the specific order or hierarchy of steps in the method can be rearranged while remaining within the scope and spirit of the disclosure. It is also understood that the various blocks depicted in the figures are presented separately for illustrative purposes. It is contemplated that while the various blocks depicted in the figures may be implemented as separate (and communicatively coupled) devices and/or processing units, they may also be integrated together without departing from the spirit and the scope of the present disclosure.

It is believed that the system and the apparatus of the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory.

What is claimed is:

1. A method comprising:
   identifying at least one of a logically or an electrically critical design element of an integrated circuit based on a design of the integrated circuit;
   determining whether the design of the integrated circuit allows for insertion of a metrology target within the integrated circuit layout proximate to the at least one of a logically or an electrically critical design element;
   modifying the design of the integrated circuit by inserting a metrology target within the integrated circuit layout proximate to the at least one of a logically or an electrically critical design element when the design of the integrated circuit allows for the insertion of the metrology target, wherein the metrology target to be inserted proximate to the at least one of a logically or an electrically critical design element is selected to provide a metrology structure oriented in a direction susceptible to failure in the least one of a logically or an electrically critical design element; and
   providing the modified design to a fabrication tool for fabricating the integrated circuit.

2. The method of claim 1, further comprising:
   modifying the design of the integrated circuit to accommodate a placement of a metrology target proximate to the at least one of a logically or an electrically critical design element.

3. The method of claim 1, wherein the metrology target to be inserted into the vicinity of the at least one of a logically or an electrically critical design element is selected based on a size, an aspect ratio, or a shape of an open area proximate to the at least one of a logically or an electrically critical design element.

4. The method of claim 1, further comprising:
   inserting an additional metrology target proximate to the at least one of a logically or an electrically critical design element when the design of the integrated circuit allows for the insertion of more than one metrology target.

5. The method of claim 4, further comprising:
   performing a design verification process to determine if the metrology target to be inserted passes physical verification requirements.

6. The method claim 5, wherein the design verification process comprises at least one of design rule checking (DRC) or a layout versus schematic (LVS) process.

7. A method, comprising:
   identifying at least one of a logically or an electrically critical design element of an integrated circuit based on a design of the integrated circuit;
   determining whether the design of the integrated circuit allows for insertion of a metrology target within the integrated circuit layout proximate to the at least one of a logically or an electrically critical design element;
   designating one or more existing features on or proximate to the at least one of a logically or an electrically critical design element as a metrology target when the design of the integrated circuit does not allow for the insertion of a metrology target proximate to the at least one of a logically or an electrically critical design element; and
   providing the one or more existing features designated as the metrology target to a metrology tool for one or more metrology measurements of the one or more existing features of the integrated circuit.

8. The method of claim 7, wherein the metrology tool comprises at least one of a critical dimension metrology tool or an overlay metrology tool.

9. An apparatus, comprising:
   a memory medium configured to store a library of metrology targets; and
   a processor in communication with the memory medium, the processor configured to:
   identify at least one of a logically or an electrically critical design element of an integrated circuit based on a design of the integrated circuit;
   determine whether the design of the integrated circuit allows for insertion of a metrology target within the integrated circuit layout proximate to the at least one of a logically or an electrically critical design element;
   modify the design of the integrated circuit by inserting a metrology target selected from the library of metrology targets within the integrated circuit layout proximate to the at least one of a logically or an electrically critical design element when the design of the integrated circuit allows for the insertion of the metrology target, wherein the metrology target to be inserted proximate to the at least one of a logically or an electrically critical design element is selected to provide a metrology structure oriented in a direction susceptible to failure in the least one of a logically or an electrically critical design element; and
   provide the modified design to a fabrication tool for fabricating the integrated circuit.

10. The apparatus of claim 9, wherein the processor is further configured to:
modify the design of the integrated circuit to accommodate a placement of a metrology target proximate to the at least one of a logically or an electrically critical design element.

11. The apparatus of claim 9, wherein the metrology target to be inserted proximate to the at least one of a logically or an electrically critical design element is selected based on a size, an aspect ratio, or a shape of an open area proximate to the at least one of a logically or an electrically critical design element.

12. The apparatus of claim 9, wherein the one or more processors are further configured to perform a design verification process to determine if the metrology target to be inserted passes physical verification requirements.

13. The apparatus claim 12, wherein the design verification process comprises at least one of design rule checking (DRC) or a layout versus schematic (LVS) process.

14. An apparatus, comprising:
a memory medium configured to store a library of metrology targets; and
a processor in communication with the memory medium, the processor configured to:
identify at least one of a logically or an electrically critical design element of an integrated circuit based on a design of the integrated circuit;
determine whether the design of the integrated circuit allows for insertion of a metrology target within the integrated circuit layout proximate to the at least one of a logically or an electrically critical design element;
designate one or more existing features on or proximate to the at least one of a logically or an electrically critical design element as a metrology target when the design of the integrated circuit does not allow for the insertion of a metrology target proximate to the at least one of a logically or an electrically critical design element; and
provide the one or more existing features designated as the metrology target to a metrology tool for one or more metrology measurements of the one or more existing features of the integrated circuit.

15. The apparatus of claim 14, wherein the metrology tool comprises at least one of a critical dimension metrology tool or an overlay metrology tool.

* * * * *